US006642859B1

United States Patent
Hamilton et al.

(10) Patent No.: US 6,642,859 B1
(45) Date of Patent: Nov. 4, 2003

(54) ACCURATE AND EFFICIENT CALIBRATING DEVICE AND METHOD

(75) Inventors: Graham S. Hamilton, San Diego, CA (US); Yusuf Cetin, Encinitas, CA (US); Alan T. Asbeck, San Diego, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/611,294

(22) Filed: Jul. 7, 2000

(51) Int. Cl.$^7$ ................................................ H03M 7/34
(52) U.S. Cl. ........................................ 341/51; 341/120
(58) Field of Search ................................. 541/178, 120, 541/144; 341/129, 155, 110

(56) References Cited

U.S. PATENT DOCUMENTS

| | | | | |
|---|---|---|---|---|
| 4,616,329 A | * | 10/1986 | Abrams et al. | 341/120 |
| 4,962,380 A | * | 10/1990 | Meadows | 341/120 |
| 5,266,951 A | * | 11/1993 | Kuegler et al. | 341/120 |
| 5,432,514 A | * | 7/1995 | Mukuda et al. | 341/120 |
| 5,644,308 A | * | 7/1997 | Kerth et al. | 341/120 |
| 5,659,312 A | * | 8/1997 | Sunter et al. | 341/120 |

* cited by examiner

Primary Examiner—Michael Tokar
Assistant Examiner—Lam T. Mai
(74) Attorney, Agent, or Firm—Farjama & Farjama LLP (57) ABSTRACT

An apparatus and method of calibrating a signal sourcing device having a plurality of signal sources to reduce errors between signals generated by the signal sources by categorizing the signal sources into groups based on the amount of error in the signal generated by the signal sources and selecting the signal sources from the groups in a manner which reduces the overall error in selecting signals. For example, the signal sourcing device may be a digital to analog converter having a plurality of current sources that output currents which may have an error. Such an improved digital to analog converter would categorize the current sources into groups based on the amount of error in the current generated by the current sources and selecting the current sources from the groups in a manner which reduces the overall error in selecting signals for the conversion process. The groups may include a center group that straddles the median current generated by the current sources. For example, the digital to analog converter may select current sources from complementary groups where current sources in complementary groups tend to have similar but opposite errors. This calibration method may be used to reduce errors in the signal sources which have a linear, Gaussian, or other error distributions.

71 Claims, 8 Drawing Sheets

ACCURATE AND EFFICIENT CALIBRATING DEVICE AND METHOD

BACKGROUND OF THE INVENTION

The field of the present invention relates generally to the calibration of signal sources; and, more particularly to a method of calibrating a signal sourcing device by selecting the signal sources in the device in a manner which tends to cancel out errors in the signal sources.

Many devices contain signal sources and select signals generated from the signal sources. However, signal sources do not generate precise signals. As a result, the overall accuracy of the device is compromised by the accuracy of the signal sources.

An example of a signal sourcing device is a digital-to-analog converter (DAC). High speed DACs are implemented by a current steering architecture. As the value of the digital code input to the DAC increases, the number of current sources steered to the output also increases. The overall accuracy of the DAC is limited by the accuracy of the current sources. A uniform error in absolute accuracy results in a gain error which may be tolerated at times. The small errors between individual current sources, due to the matching limitations, result in errors in the output of the DAC as the digital codes inputted to the DAC change. These errors in the current sources limit the linearity and accuracy of the DAC. As a result, engineers have attempted to reduce the error in the accuracy of the DAC by, for example, calibrating the current sources in the DAC.

Prior art methods of calibrating a DAC included various techniques. One technique includes the calibration of the current sources in the DAC by using external, high quality test equipment. For example, the DAC may have an array of current sources including extra current sources. A technician would use the high quality test equipment to measure the current output by each current source and select the most accurate current sources for use in the DAC. However, this approach cannot remember the proper current sources to select for the particular integrated circuit containing the DAC unless if a non-volatile memory is used such as laser trimming or fuses. Thus, another approach was to use the external high quality test equipment to determine the accuracy of each current source and then trim each current source to become more accurate. Trimming current sources or the components of current sources, is a costly and slow procedure. For example, an eleven bit DAC may use 2047 current sources and the cost and time to trim that many current sources is very substantial.

Yet another prior approach was to attempt to do on-chip calibration of the current sources. The calibration could occur at power on, or whenever requested, if implemented on an integrated circuit. One difficulty with an implementation in an integrated circuit is the difficulty in implementing a reference and calibration circuit with sufficient accuracy on an integrated circuit. The reason is that, for example, for an eleven bit DAC, the accuracy of the calibration circuit must be greater than eleven bits which is very hard to accomplish. On-chip calibration techniques for a DAC include rotating the selection of the current source for each cycle of the DAC in order to average the current sources so that the DAC effectively sees no large variations between the different current sources. Another on-chip calibration technique for a DAC is to measure the accuracy of each current source on the chip with an accurate analog-to-digital converter (ADC), a costly endeavor, and then to trim the current sources to be more accurate, another costly and time consuming process.

Thus, there is a need for a method to calibrate DACs in a cost and time effective manner by improving the accuracy of the current sources which in turn improves the overall accuracy of the DAC. There is also a need to create a more accurate DAC where the accuracy of the DAC can be repeatedly executed without having to recalibrate the DAC every time.

Further limitations and disadvantages of conventional systems will become apparent to one of skill in the art after reviewing the remainder of the present application with reference to the drawings.

SUMMARY OF THE INVENTION

Various separate aspects of the present invention can be found in a method of calibrating a device having a plurality of signal sources, each source generating a signal, by categorizing the signal sources into groups based on the amount of error in the signal generated by the signal sources and selecting the signal sources in the device from the groups in a manner which reduces errors in the selection process.

The signal sourcing device may be, for example, a DAC having a plurality of current sources, each current source generating a current. The current sources generate currents having a median value, where some of the currents have errors relative to the median value. The improved DAC categorizes the current sources into groups based on the amount of error in the current and selects the current sources from the groups in a manner which reduces the overall error in the selection process. Because the overall accuracy of a DAC is limited by the accuracy of the current sources, the improved DAC reduces the effect of errors between individual current sources on the output of the DAC. More specifically, the improved DAC selects a first current value, determines whether the current generated by each current source of the plurality of current sources is greater than, substantially equal to, or less than the first current value, determines whether the number of the current sources whose current is greater than the first current value is more than, less than or substantially equal to the number of the plurality of current sources whose current is less than the possible median current value, and adjusts the first current value to be closer to the median current. The improved DAC may repeat these steps until the number of the current sources whose current is greater than the first current value is equal or substantially equal to the number of the plurality of current sources whose current is less than the possible median current value. At this time, the first current will approximate the true median current value. The improved DAC may then categorize each current source into one of a plurality of groups based on the current generated by the current source, wherein each group covers a mutually exclusive range of currents. In one embodiment, each group of current sources has a complementary group of current sources. In another embodiment, there is a center group of current sources whose range of currents straddles the true median current and each of the remaining groups of current sources has a complementary group. Thus, by categorizing the current sources in the digital to analog converter into groups based on the amount of error in the current generated by the current sources, the improved DAC can select the current sources in the digital to analog converter from the groups in a manner which reduces errors in the conversion. For example, the DAC may select the current sources from complementary groups where current sources in complementary groups tend to have similar but opposite errors. This calibration method may be used to reduce errors in the current sources which have a linear error distribution, a Gaussian error distribution, a combination of linear and Gaussian error distribution, or other error distributions or their combinations.

The improved signal sourcing device may be used in any device having a plurality of signal sources such as a television, tuner, settop box, computer, computer component such as a display or monitor, vehicle, antenna, broadcast receiver, broadcast transmitter, wireless handset, modem, camera, or other imaging device.

Other aspects, advantages and novel features of the present invention will become apparent from the following Detailed Description Of A Preferred Embodiment, when considered in conjunction with the accompanying drawings.

DETAILED DESCRIPTION OF A PREFERRED EMBODIMENT

This patent specification describes a system and method for creating a more accurate signal sourcing device by calibrating the signal sources in the device in a cost effective, reduced time, and repeatable manner. The specific implementations discussed below and in reference to the figures do not explicitly exclude other embodiments or configurations.

First, a signal sourcing device may be any device that contains a plurality of signal sources, each signal source outputting a signal. The signal generated by a signal source may have imprecise characteristics; for example, the signals may be intended to have the same voltage magnitude, but due to various factors, the signals have varying voltage magnitudes. As another example, the signals may be intended to have the same current amperage, but the actual current amperage of the signals vary from a median. Although the signal sourcing device may be any signal sourcing device, an embodiment based on a DAC will be discussed in order to illustrate the real-life benefits of an example application of the invention. Thus, while the figures specifically mention the current sources of a DAC, it is apparent that the figures may readily be adapted for any kind of signal source.

A DAC may have numerous current sources. For example, an eleven bit DAC may have 2047 current sources, all of which might need calibration. Some of these current sources will produce a more accurate current than other current sources and among the various current sources, each current source will have a different amount of error in the current produced. If the errors in the current sources distribute themselves in a Gaussian manner or in a linear manner, a system or method which practices the present invention can correct for those errors.

Figure 1:
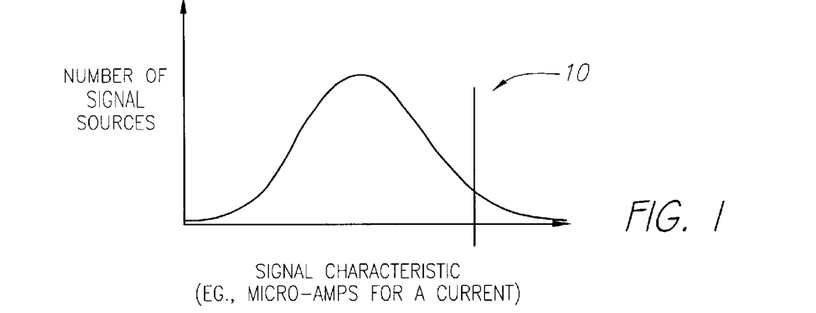
FIG. 1 is an example of a Gaussian error distribution graph of signal sources in a signal sourcing device.

We first discuss the situation where the errors in the current sources lie in a Gaussian distribution, as shown in FIG. 1. The error distribution graph of FIG. 1 has a vertical axis representing the number of current sources and a horizontal axis representing the amount of current produced by the current source. The peak of the Gaussian distribution graph is the median of the amounts of current produced by the current sources. In the situation where this true median results in a gain error, the gain error may be corrected through methods of correcting gain errors known to those of skill in the art.

Figure 2:
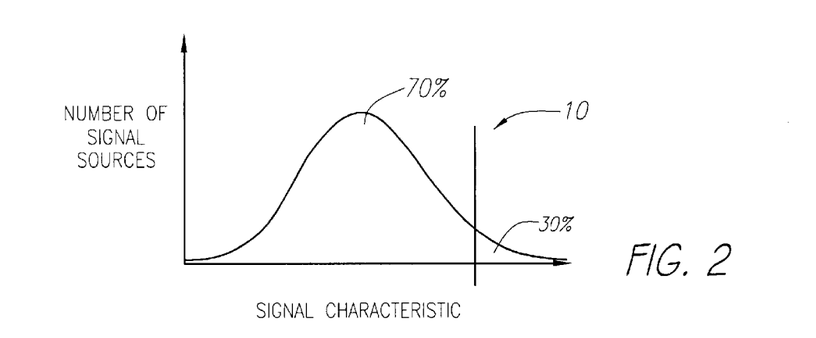
FIG. 2 is an example of a Gaussian error distribution graph of signal sources in a signal sourcing device showing the percentage of signal sources falling above and below the guessed median.

FIGS. 1–4 illustrate the steps that an example embodiment of a DAC calibrator system built in accordance with the present invention uses to calibrate the current sources in a DAC in an example case. Turning to FIG. 2, the system selects any arbitrary guess 10 for the median current value (e.g., a possible median current value). The next step is to use a comparator to determine whether each individual current source produces a current above this selected median 10, at the selected median 10, or below the selected median 10. The comparator may be any kind of comparator including a current comparator or a voltage comparator. The comparator further may include any amounts, if any, of offsets. Additionally, the comparator may have any constant error built into it because constant errors in the comparator will not effect the outcome of this calibration process. A comparator that has a constant error is a comparator that makes the same error (or substantially the same error) for each comparison. By comparing the selected median 10 with the actual current produced by each current source, the system is able to determine how many of the current sources fall above the selected median 10 and how many fall below the selected median 10. Thus, as shown in the example of FIG. 2, 30% of the current sources fall above the selected median 10 while 70% of the current sources fall below the selected median 10. Thus, FIG. 2 illustrates the typical case where the guessed median 10 is not the true median of the Gaussian distribution. While the DAC may compare every current source with the selected median current value, the DAC may alternatively compare a subset of the current sources with the selected median current source on the assumption that a sampled subset of the current sources may provide a reasonable approximation of the true median current value.

Figure 3:
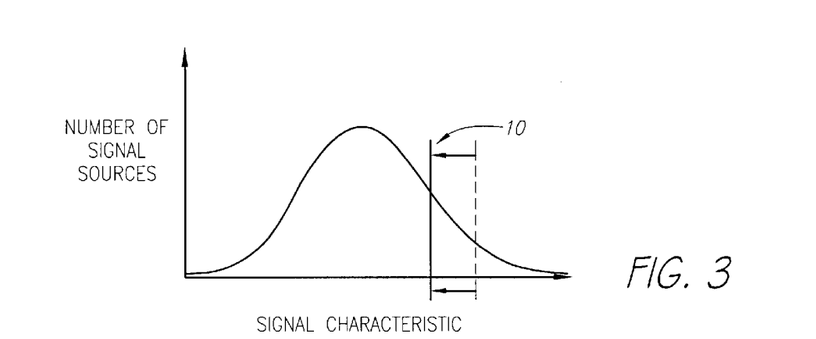
FIG. 3 is an example of a Gaussian error distribution graph of signal sources in a signal sourcing device built in accordance with the present invention where the guessed median value is adjusted to be closer to the true median.
Figure 4:
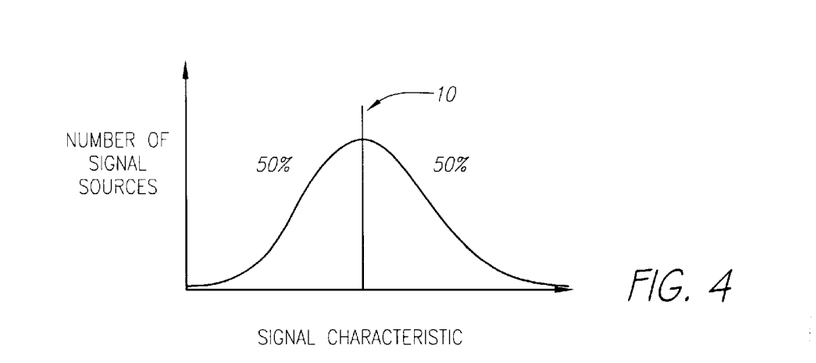
FIG. 4 is an example of a Gaussian error distribution graph of signal sources in a signal sourcing device built in accordance with the present invention where the guessed median value is equal or substantially close to the true median.

Turning to FIG. 3, the system realizes that the selected median 10 is not the actual median and adjusts the selected median 10 to be closer to the actual median. In the example shown in FIG. 3, the system selects a new guessed median value 10 which is closer to the actual median of the Gaussian distribution. Now that a new selected median 10 has been chosen, the system again uses the comparator to determine the number of current sources which fall above the guessed median 10 and the number of current sources which fall below the guessed median 10. This process of selecting and correcting the guessed median 10 repeats until the system finds a guessed median 10 that is the actual median of the Gaussian distribution or within an acceptable tolerance of the actual median, as shown in FIG. 4. For the sake of convenience, the final selected median 10 in FIG. 4 which is either the actual median or very close to the actual median is referred to as the "final median." At this point, the system knows exactly which of the individual current sources lie above the final median and which ones fall below it. This information about the details of the error in the current generated by each current source is maintained for later use in, for example, a memory. See, for example, step 41 of FIG. 12. This information about each particular current source is then used to create a more accurate DAC.

Figure 10:
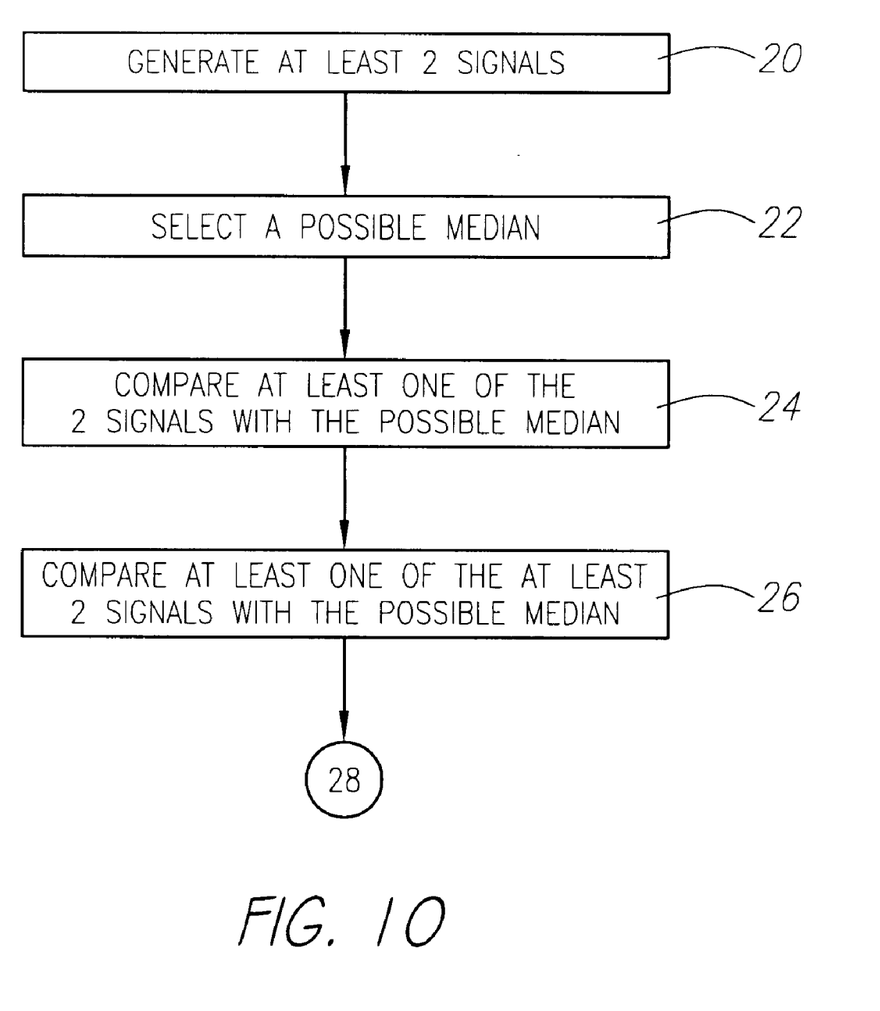
FIG. 10 is a flowchart for an example embodiment of an improved signal sourcing device.

FIG. 10 is a flowchart for an example embodiment of an improved signal sourcing device. In step 20, the improved signal sourcing device generates at least two signals, which, for example, may be voltage or current signals. The improved signal sourcing device then selects a possible median value, as shown in step 22. In step 24, at least one of the signals is compared with the possible median value. In step 26, the possible median value is adjusted depending upon the result of the comparison in step 24. In this simple example embodiment, the flowchart may exit at step 28 or repeat as needed until the possible median value is determined to be close enough to the actual median.

When a DAC operates, a certain number of current sources will be selected at a time, depending on the digital input code being converted into analog. For example, the selected current sources can be turned on, turned off, have current steered to them, etc. Knowing the digital code to be converted into an analog value, the system can determine how many current sources must be turned on. By knowing how many current sources must be turned on and the distribution of error in the current sources, the system selects the appropriate current sources in order to minimize the overall error in the DAC. For example, the system will select an equal number of current sources that are below the final median as those which are above the final median. If there is an odd number of current sources to select, the system selects an equal number of current sources which fall below the final median as the number of current sources which fall above the final median and for the odd current source, the system selects any current source. Because a high speed DAC having many bits usually selects many current sources, the impact of the odd current source is not significant on the overall accuracy of the DAC.

An alternative embodiment of a system which practices the present invention is now described. In order to make the overall output of the DAC even more accurate, the system can measure the actual current produced by each current source and, instead of grouping the current sources into two groups (e.g., those falling above the final median and those falling below the final median), the system can group the current sources into any number of groups. The greater the number of groups, the greater the accuracy of the resulting DAC. In the example shown in FIG. 5, the system categorizes the current sources into six groups. The current sources placed in Group +A are collectively more accurate than those in Group +B and those in Group +B are collectively more accurate than those in Group +C. Similarly, the current sources in Group −A are collectively more accurate than the current sources in Group −B and the current sources in Group −B are more accurate collectively than those in Group +C. For a truly symmetrical Gaussian distribution, the current sources placed in Group +A would collectively have no greater or lesser error than those in Group −A. Likewise, the current sources placed in Group +B and Group −B would have a similar amount of absolute error, while those in Groups +C and −C would have similar absolute errors as well. Of course, while this example shows the current sources being divided into six groups, the system may divide the current sources into any number of groups where the greater the number of groups, the more accurate the DAC can be. Certainly, the system can create any number of groups, larger or smaller than six, and the number of groups can be even, odd, or any number.

Every time the DAC needs to select a certain number of current sources, the system selects current sources from the appropriate groups in a manner which minimizes the overall error of the DAC. In other words, current sources are selected from the appropriate groups so as to cancel errors in the current sources. For example, if twelve current sources are to be selected by the DAC, the system may select, for example, two current sources from each of Groups +A, −A, +B, −B, +C and −C. Alternatively, the system may, for example, select six current sources from Group +B and six current sources from Group −B. As yet another alternative, the system may, for example, select four current sources from Group +A, four current sources from Group −A, two current sources from Group +C and two current sources from Group −C. Although a couple examples of how the system may select current sources from each of the groups have been presented here, it is important to note that the system may select current sources from the group in any combination or manner which reduces the overall error in the DAC.

In practice, when the DAC must select a certain number of current sources, additional circuitry in or adjacent to the DAC selects which current sources. If an even number of current sources is to be selected, the system may take symmetrically from complimentary groups; that is, Groups +A and −A are complementary, Groups +B and −B are complementary and Groups +C and −C are complementary.

Figure 9:
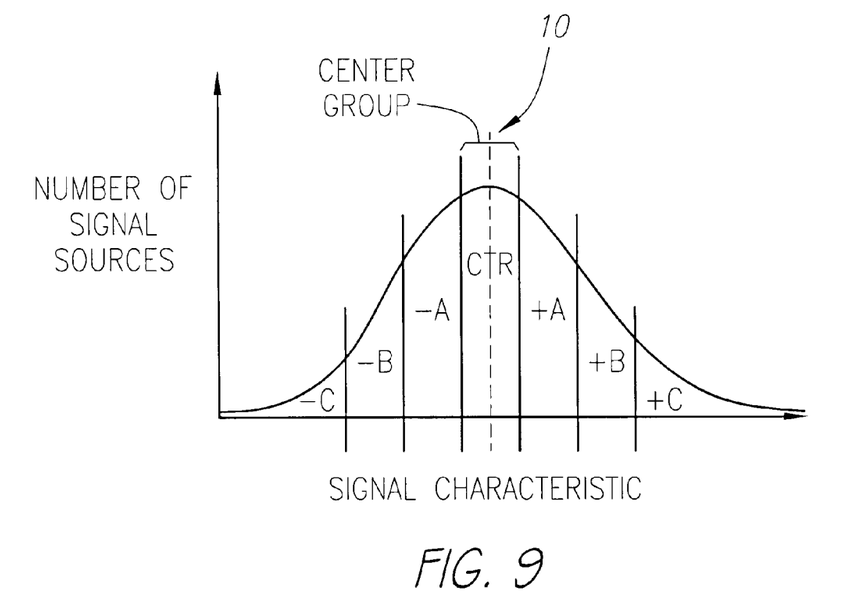
FIG. 9 is another example of a Gaussian error distribution graph of signal sources in a signal sourcing device in accordance with the present invention where the signal sources are divided into more than two groups and has a center group.

Yet another alternative embodiment is described below with reference to FIG. 9. In this example embodiment, the system defines a center group which straddles both sides of the median of the Gaussian distribution and then defines additional groups to the left and right of that center group, as shown in FIG. 9. While this particular embodiment which has a center group may be used for selecting an even number of current sources, it is particularly useful in situations where an odd number of current sources is to be selected. When an odd number of current sources must be selected, the system may choose the odd current source from the center group and select an even number of current sources symmetrically from the remaining groups. Again, because a large number of current sources are typically selected in a high bit DAC, the single odd current source will have a small effect on the overall accuracy of the DAC.

Figure 11:
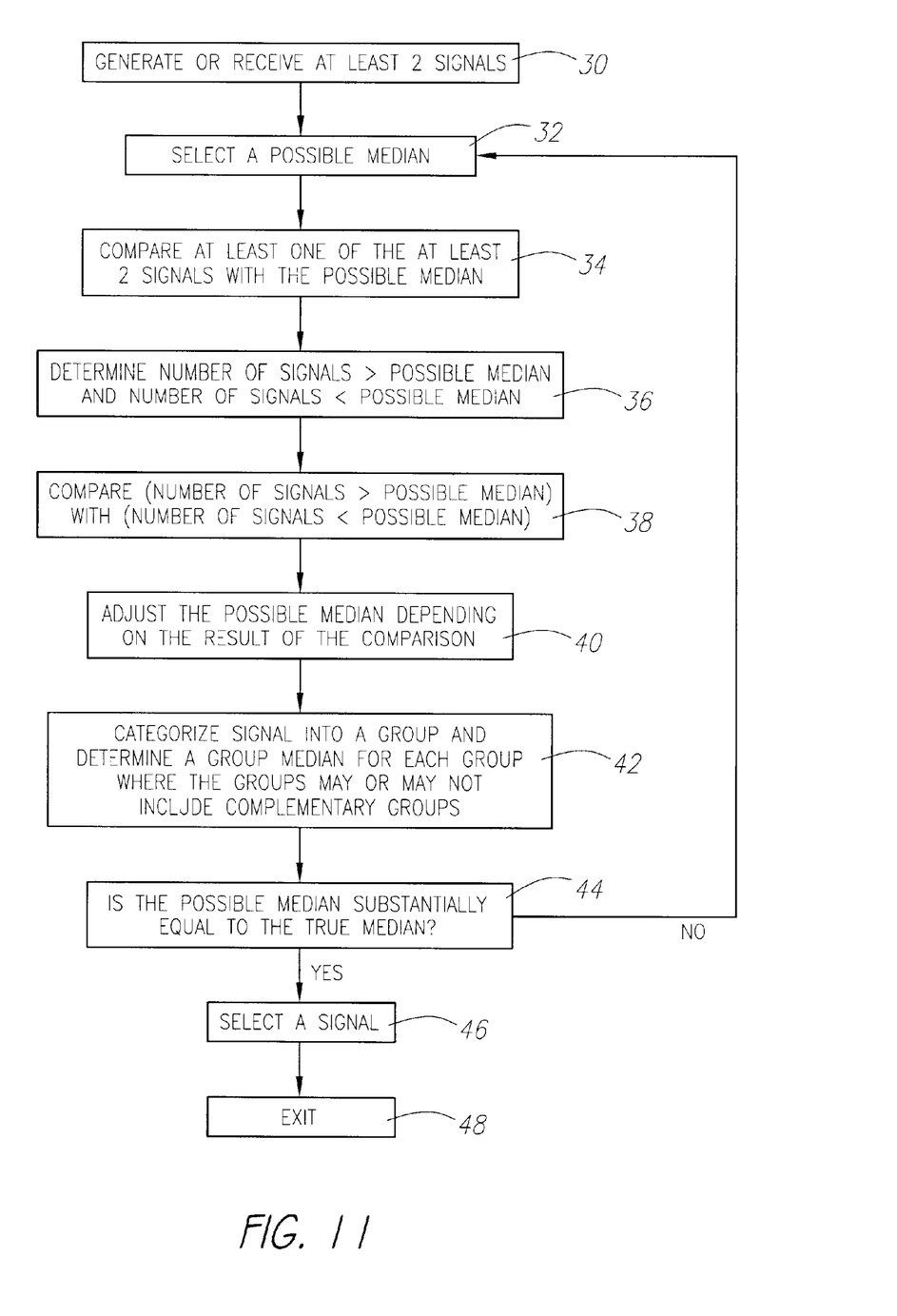
FIG. 11 is a flowchart for another example embodiment of an improved signal sourcing device.

FIG. 11 is a flowchart for another example embodiment of an improved signal sourcing device. The example flowchart shown in FIG. 11 categorizes each signal into a group as discussed above. In step 30, the improved sourcing device generates or receives at least two signals, which may be voltage or current signals. A possible median value is selected in step 32. In step 34, at least one of the signals is compared with the possible median value. In step 36, the improved sourcing device determines the number of signals which exceed the possible median value and the number of signals which fall below the possible median value. In step 38, the improved sourcing device compares the number of signals which exceed the possible median value with the number of signals which fall below the possible median value in order to determine whether the possible median value is likely to be higher than or less than the actual median. In step 40, the possible median is adjusted depending on the result of the comparison in step 38. In step 42, the improved signal sourcing device categorizes each signal into one of a plurality of groups. For example, the groups may be any of the groups described in this disclosure. A group median value is determined for each group. As also described in this disclosure, the groups may or may not include complementary groups and may or may not include a center group. The groups may include any of the other features described in this disclosure such as groups and complementary groups which are substantially equidistant from the final median. In step 44, the improved sourcing device determines whether the possible median is substantially equal to the true or actual median. If the possible median is not substantially equal to the true median, the process selects another possible median, and the process repeats. If the possible median is substantially equal to the actual median, the improved sourcing device may select to use one of the signals in step 46 and exit in step 48.

Figure 12:
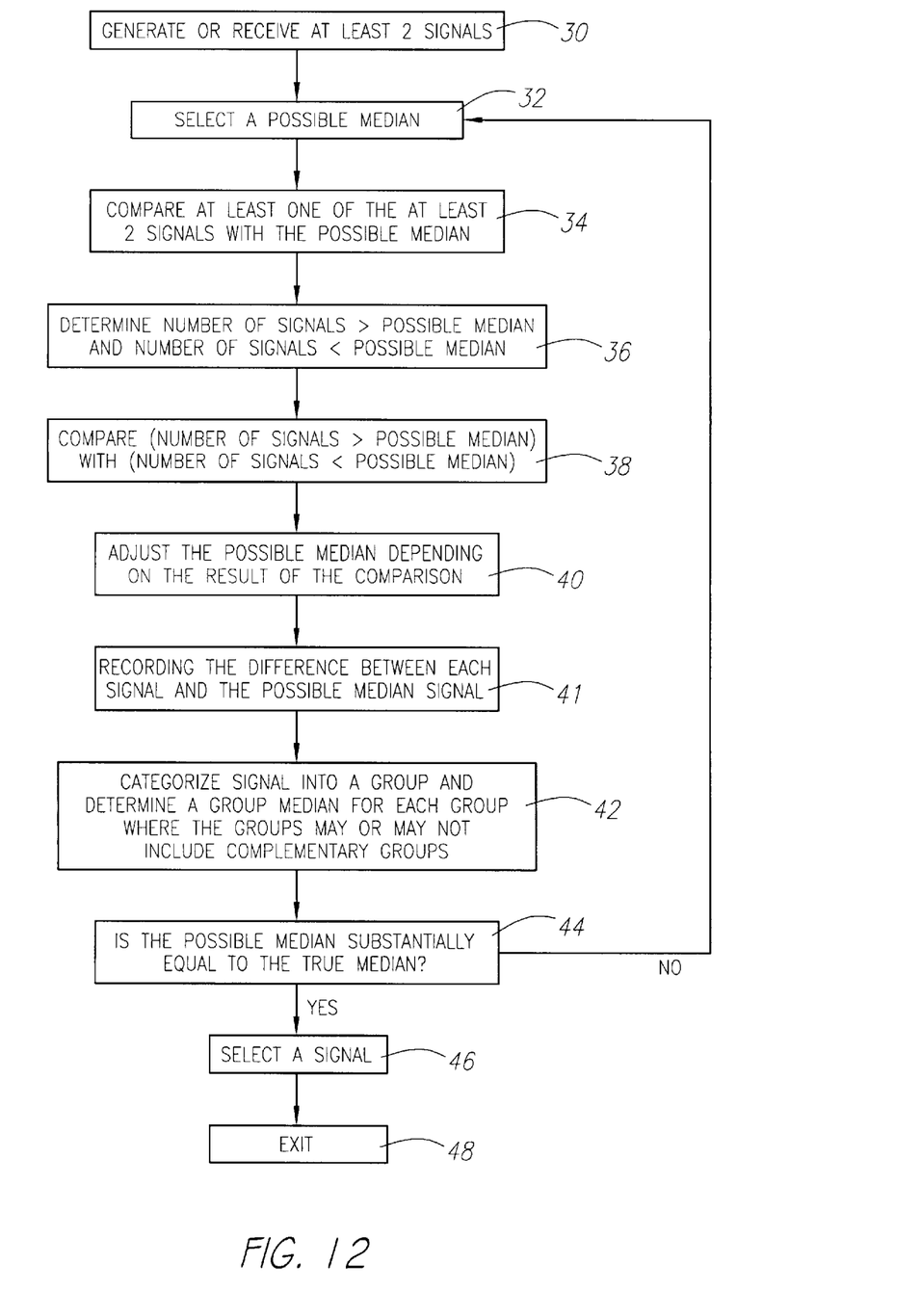
FIG. 12 is a flowchart for yet another example embodiment of an improved signal sourcing device.

FIG. 12 is a flowchart for yet another example embodiment of an improved signal sourcing device. The flowchart of FIG. 12 is essentially that of FIG. 11, except that FIG. 12 adds a step 41. In step 41, the difference between each signal and the possible median is recorded in, for example, a memory as previously described.

Figure 6:
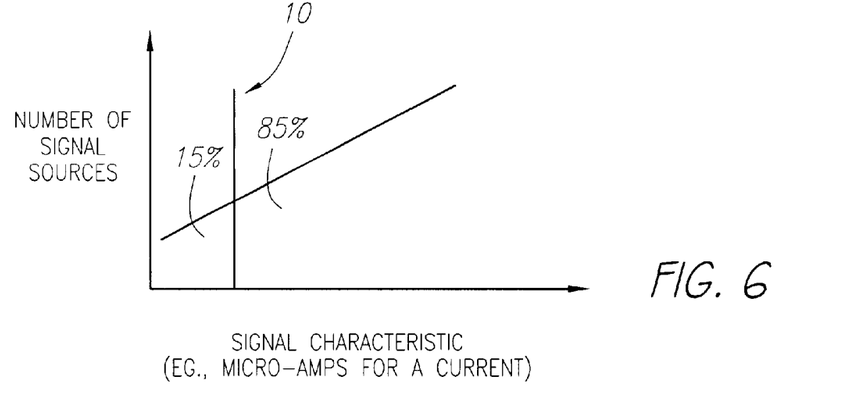
FIG. 6 is an example of a linear error distribution graph of signal sources in a signal sourcing device showing the percentage of signal sources falling above and below the guessed median.
Figure 7:
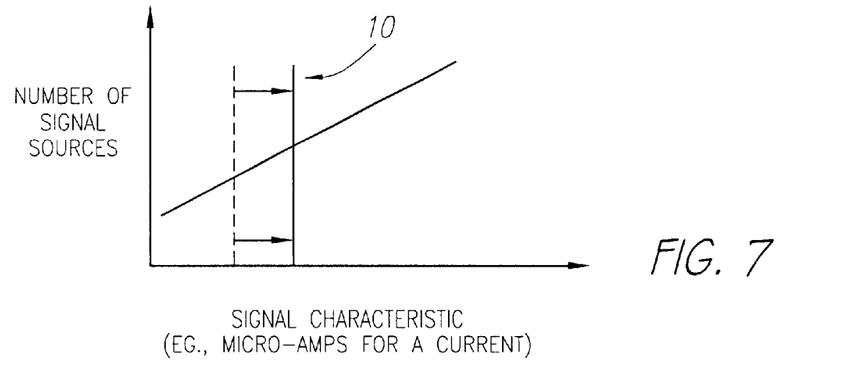
FIG. 7 is an example of a linear error distribution graph of signal sources in a signal sourcing device built in accordance with the present invention where the guessed median value is adjusted to be closer to the true median.
Figure 8:
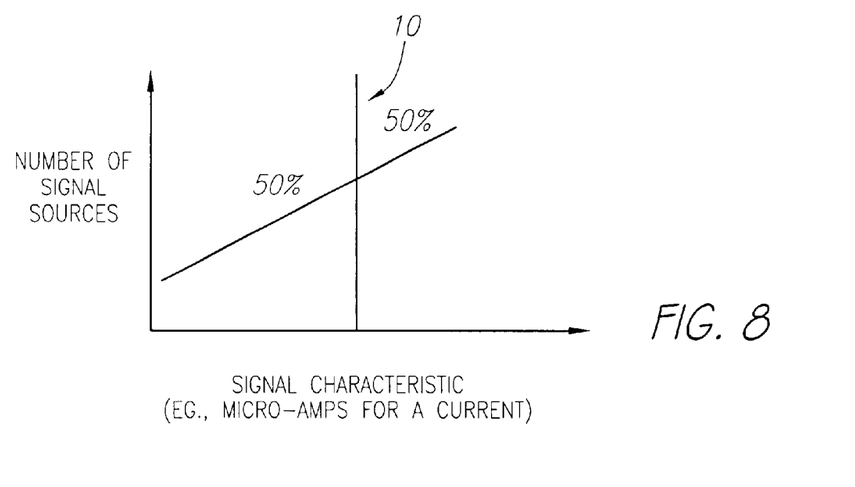
FIG. 8 is an example of a linear error distribution graph of signal sources in a signal sourcing device built in accordance with the present invention where the guessed median value is equal or substantially close to the true median.

This process also may be used to correct for linear errors or gradients in the current sources, as shown in FIGS. 6–8. FIG. 6 also indicates the number of current sources (vertical axis) that generate a given current (horizontal axis). The example shown in FIG. 6 depicts an inclining graph. Certainly, any linear distribution including declining and flat graphs are contemplated as error distributions that can be corrected by the improved method described here. Again, the system selects any arbitrary guess 10 for the median current value. The next step is to use a comparator to determine whether each individual current source produces a current above this selected median 10, at the selected median 10, or below the selected median 10. As before, the comparator may be any kind of comparator including a current comparator or a voltage comparator. The comparator further may include any amounts, if any, of offsets. Additionally, the comparator may have any constant error built into it because constant errors in the comparator will not effect the outcome of this calibration process. By comparing the selected median 10 with the actual current produced by each current source, the system is able to determine how many of the current sources fall above the selected median 10 and how many fall below the selected median 10. Thus, as shown in the example of FIG. 6, 85% of the current sources fall above the selected median 10 while 15% of the current sources fall below the selected median 10. Thus, FIG. 6 illustrates the typical case where the guessed median value 10 is not the true median of the linear distribution.

Turning to FIG. 7, the system realizes that the selected median 10 is not the actual median and adjusts the selected median 10 to be closer to the actual median. In the example shown in FIG. 7, the system selects a new guessed median value 10 which is closer to the actual median of the linear distribution. Now that a new selected median 10 has been chosen, the system again uses the comparator to determine the number of current sources which fall above the guessed median 10 and the number of current sources which fall below the guessed median 10. This process of selecting and correcting the guessed median 10 repeats until the system finds a guessed median 10 that is the actual median of the linear distribution or within an acceptable tolerance of the actual median, as shown in FIG. 8. At this point in FIG. 8, the system knows exactly which of the individual current sources lie above the final median 10 and which ones fall below it. As before, information about the details of the error in the current generated by each current source is maintained for later use in, for example, a memory and is then used to create a more accurate DAC. When a DAC operates, the system selects the appropriate current sources in order to minimize the overall error in the DAC. For example, the system will select an equal number of current sources that are below the final median as those which are above the final median.

Figure 13:
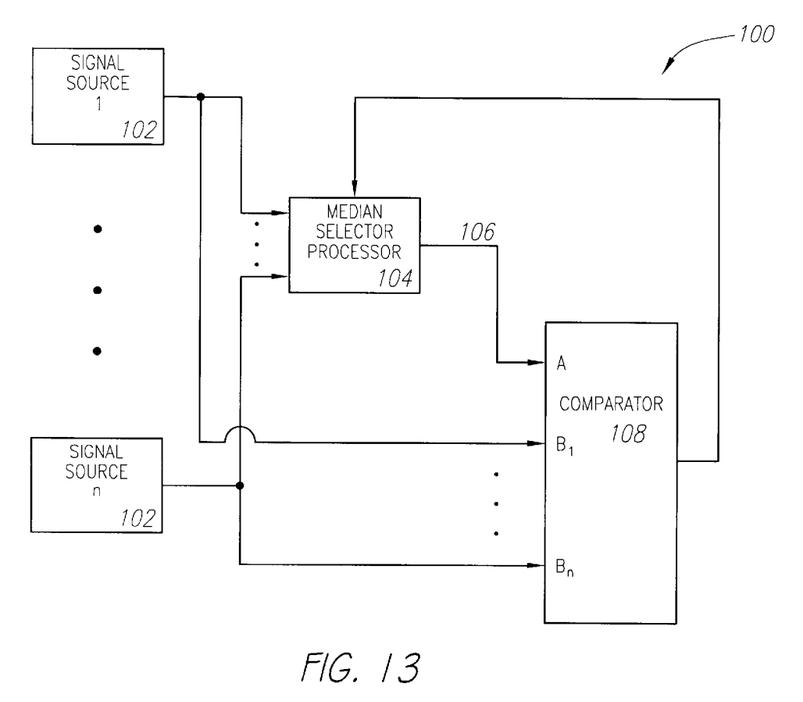
FIG. 13 is a high level representation of a block diagram of an example embodiment of an improved signal sourcing device.

FIG. 13 is a high level representation of a block diagram of an example embodiment of an improved signal sourcing device. The improved signal sourcing device 100 includes at least one signal source 102. The signal source or sources 102 preferably sends a plurality (n) of signals to a median selector processor 104. The median selector processor 105 outputs a possible median 106 to a comparator circuit 108. The signals from the signal source 102 are sent to inputs B, to B, of comparator circuit 108. The comparator circuit 108 compares at least one of the incoming signals from the signal source 102 with the possible median 106, received at input A. The result 110 of the comparison is used by the median selector processor 104 to adjust or maintain the possible median 106. As previously stated, the improved sourcing device 100 may repeat this process until the possible median 106 is sufficiently close to the actual median, as desired. As stated in this disclosure, the signal sources may be voltage or current sources and the signal generated by each current source is a voltage or current, for example. The median selector processor 104 may also include an error reduction system that causes the median selector processor 104 and the comparator 108 to repeat their process until the possible median 106 is sufficiently close to the actual median. The improved signal sourcing device 100 may also include a categorizer which may be in the median selector processor 104 or another processor, which categorizes each signal source 102 into one of a plurality of groups based on the signals generated by the signal source 102. The groups may be any of the groups described in this disclosure, for example. The groups may or may not include complementary groups and may or may not include a center group. In categorizing each signal source 102, the improved signal sourcing device 100 knows the error generated by that signal source 102. Of course, the improved sourcing device 100 may include any of the other features described in this disclosure such as having groups which are substantially equidistant from the final median. For example, when the improved signal sourcing device 100 has to select two signals, it tries to select signal sources 102 (e.g., signal source 1 and 2) which are complementary in order to cancel errors. Any odd signal source 102 may be selected from a center group if a center group exists.

Figure 5:
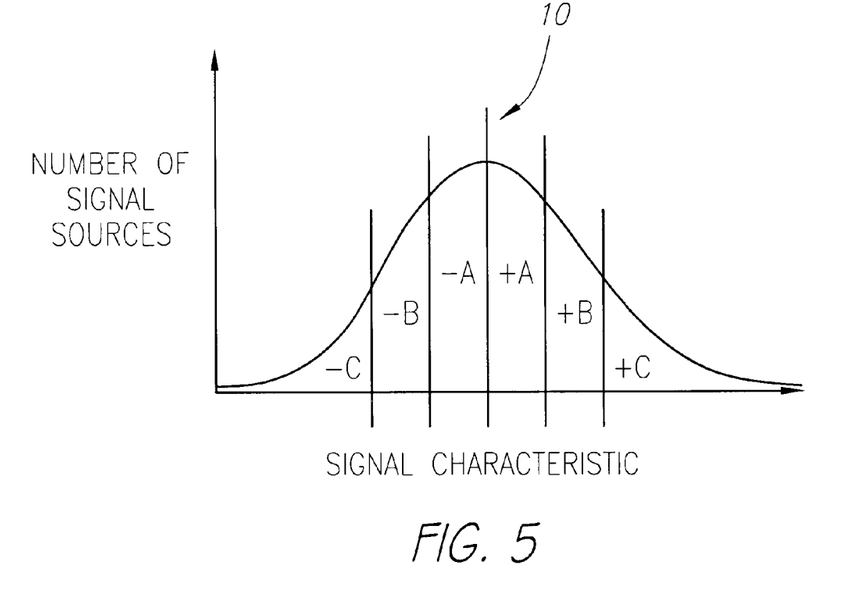
FIG. 5 is another example of a Gaussian error distribution graph of signal sources in a signal sourcing device built in accordance with the present invention where the signal sources are divided into more than two groups.

As previously shown in FIG. 5, the system may divide the linear distribution into any number of groups where the greater the number of groups, the more accurate the DAC can be. Certainly, the system can create any number of groups and the number of groups can be even, odd, or any number. Alternatively, the system may create a center group and then additional groups to either side of the center group. As with any system described in this specification, the system may select current sources from the group in any combination or manner which reduces the overall error in the DAC's. Therefore, this process can be used to cancel errors having a Gaussian distribution, a linear distribution, a distribution based on the sum of linear and Gaussian distributions, or other error distributions or their combinations.

The selection of current sources from the appropriate groups may be applied to the entire DAC or to a portion of it. For example, a DAC may be split into a most significant byte (MSB) and least significant byte (LSB) where this calibration process may be applied to either the MSB or LSB portions. Thus, this calibration process reduces the Gaussian distributed errors, linear errors or linear distributed errors in a simple and cost effective manner which may successfully be applied to DAC's even at high frequencies. A further enhancement of this calibration method is to first find a median of a small random subset of the main array of current sources and then this value can be used as a starting point to finding the median of the main array of current sources. This approach reduces the number of times the entire main array must be sorted which speeds up the sorting process.

Figure 16:
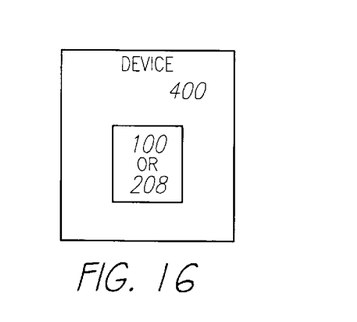
FIG. 16 is a high level block diagram representation which illustrates that the example embodiments of the improved signal sourcing devices 100 or 208 may be incorporated into another device 400.

The improved signal sourcing device 100 or 208 may be used in any system 300, as shown in FIG. 16. For example, the improved signal sourcing device 100 or 208 may be used in a television, tuner, settop box, computer, computer component such as a display or monitor, vehicle, antenna, broadcast receiver, broadcast transmitter, wireless handset, modem, camera, or other imaging device. If the improved signal sourcing device 100 or 208 were a DAC, the DAC likewise could be used in any of these example devices.

Figure 14:
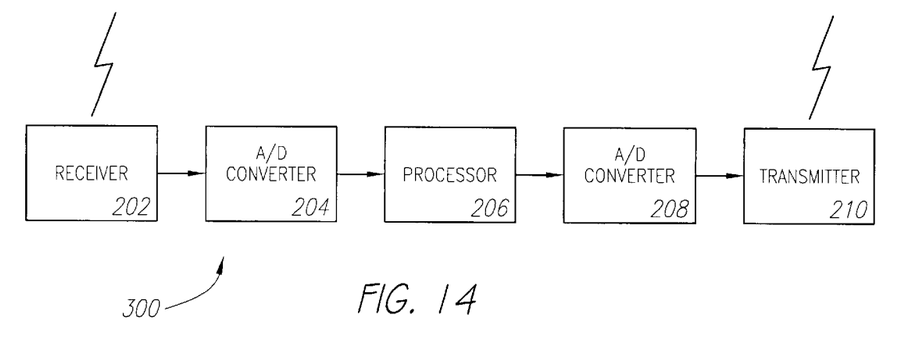
FIG. 14 is a high level block diagram representation of a data communications system which incorporates the improved signal sourcing device in a digital-to-analog converter.

As another example, the DAC may be used in a data communication system 300, as shown in FIG. 14. FIG. 14 is a high level block diagram representation of a data communications system which incorporates the improved signal, sourcing device in a digital-to-analog converter. The receiver 202 and transmitter 210 may be wireless as illustrated in FIG. 14 or wired. A data communication system 300 may comprise a receiver 202 that receives a first analog signal, an analog to digital converter 204 that converts the first analog signal to a digital signal, a data processor 206 such as a microprocessor or microcontroller or other control circuit that processes the first digital signal, the improved DAC 208 that converts the digital signal to a second analog signal and a transmitter 210 that transmits the second analog signal. Such data communication systems include, for example, a modem, satelite transmission system, cable modem, facsimile machine and CD player/recorder system.

Figure 15:
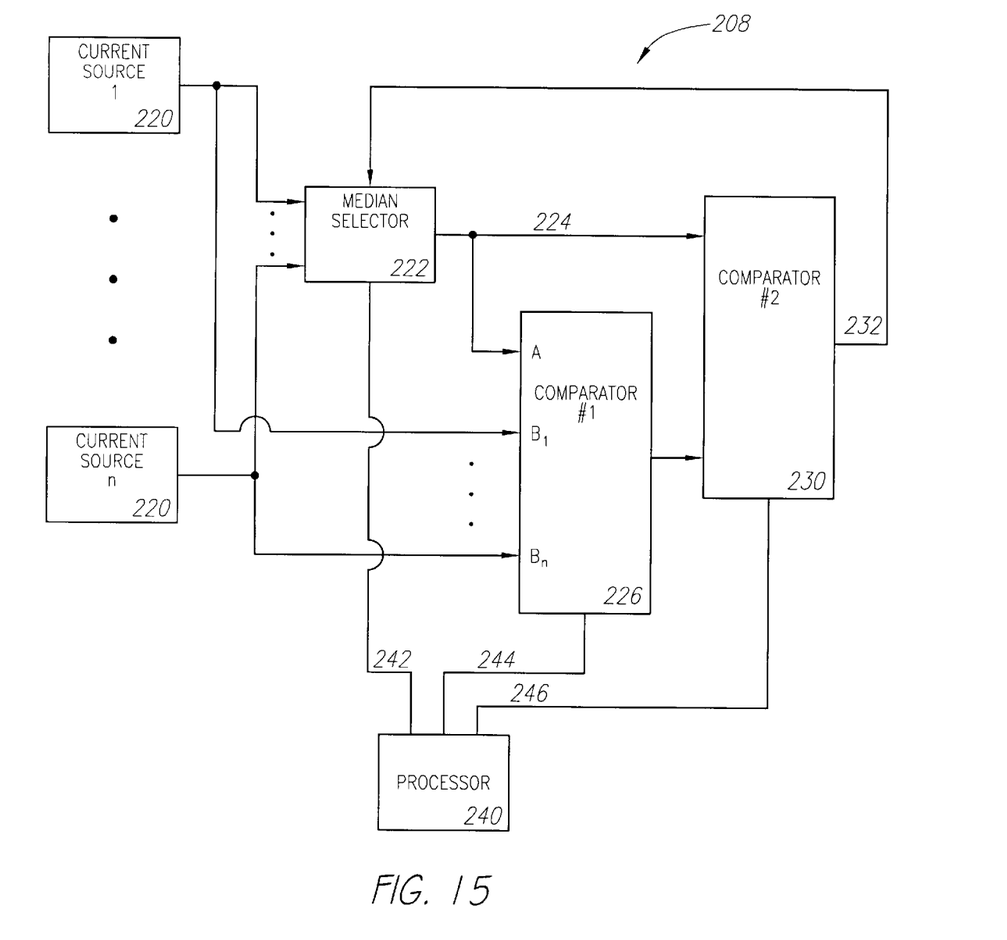
FIG. 15 is a high level block diagram representation of an example embodiment of a digital-to-analog converter which has the improved signal sourcing device.

FIG. 15 is a high level block diagram representation of an example embodiment of a digital-to-analog converter which incorporates the improved signal sourcing device as a current source. For example, the improved DAC 208 may include a plurality of current sources 220, each of which sends a current to a median selector 222. The median selector selects a possible median value 224 and sends the possible median 224 to first comparator circuit 226 and a second comparator circuit 230. In this example embodiment, the first comparator circuit 226 also receives each of the current signals from the current sources 220 at inputs $B_1$ to $B_n$. The first comparator circuit 226 preferably compares each of the current signals to the possible median 224 received at input A. The result 228 of the comparison is sent to the second comparator circuit 230. The second comparator 230 compares the number of current sources whose current is greater than the possible median 224 with the number of current sources 220 whose current is less than the possible median 224. The result 232 of the second comparator circuit 230 is sent to the median selector 222 so that the median selector 222 can adjust the possible median 224 to be closer to the actual median. An optional processor 240 may control the median selector 222 via line 242, the first comparator circuit 226 via line 244 and/or the second comparator circuit 230 via line 246. The optional processor 240 may also receive information from the median selector 222, the first comparator 226 and/or the second comparator 230.

While embodiments and implementations of the subject invention have been shown and described, it should be apparent that many more embodiments and implementations are within the scope of the subject invention. Accordingly, the invention is not to be restricted, except in light of the claims and their equivalents.

What is claimed is:

1. A method for approximating the median signal value in a device having multiple signal sources, the method comprising the steps of:
    (a) generating at least two signals, each of the at least two signals being generated from a different signal source;
    (b) selecting a possible median signal value;
    (c) comparing at least one of the at least two signals to the possible median signal value;
    (d) adjusting the possible median signal value based on the comparing step; and
    (e) repeating steps (b) and (c) until the possible median signal value is substantially equal to a true median signal value of the at least two signals.

2. The method of claim 1 further comprising the step of:
    (f) categorizing each signal source into one of a plurality of groups based on signals generated by the signal source, wherein each of the plurality of groups covers a mutually exclusive range of signals and has a group median signal value.

3. The method of claim 2 wherein each of the plurality of groups has a complementary group where the group median signal value of each of the plurality of groups and its complementary group are substantially equally distant from the true median signal value.

4. The method of claim 3 wherein the group median signal value of each of the plurality of groups and its complementary group are substantially equally distant from the true median signal value if the absolute value of the difference between the group median value of each of the plurality of groups and the possible median signal value is substantially equal to the absolute value of the difference between the group median signal value of the complementary group and the possible median signal value.

5. The method of claim 2 wherein the plurality of groups include a center group whose range of signals includes the true median signal value.

6. The method of claim 3 wherein the plurality of groups include a center group whose range of signals includes the true median signal value and the center group has no complementary group.

7. The method of claim 5 wherein the plurality of groups further comprise remaining non-center groups, each of the remaining non-center groups having a complementary group where the group median signal values of each of the remaining non-center groups and its complementary group are substantially equally distant from the true median signal value.

8. The method of claim 3 further comprising the step of selecting the signal source such that for each signal source selected from the plurality of groups, another signal source is selected from the complementary group.

9. The method of claim 7 further comprising the step of selecting the signal source such that for each signal source selected from the plurality of groups, another signal source is selected from the complementary group and any odd signal source to be selected is selected from the center group.

10. The method of claim 8 wherein the step of selecting the signal sources selects those signal sources categorized in groups closest to the true median signal value.

11. The method of claim 9 wherein the step of selecting the signal sources selects those signal sources categorized in groups closest to the true median signal value.

12. The method of claim 8 wherein the device is a digital-to-analog converter and the selecting step converts a digital signal into an analog signal.

13. The method of claim 1 wherein the device is a television further comprising a processor adapted to process at least one signal from the multiple signal sources and a display adapted to display an image.

14. The method of claim 1 wherein the device is a tuner, broadcast receiver, or broadcast transmitter further comprising an interface adapted to receive or transmit a broadcasted signal and a processor adapted to process the broadcasted signal.

15. The method of claim 1 wherein the device is a wireless handset further comprising an interface adapted to communicate with a wireless system and a processor adapted to process at least one signal from the multiple signal sources.

16. The method of claim 1 wherein the device is a modem further comprising an interface adapted to communicate with a telephone line and a processor adapted to process at least one signal from the multiple signal sources.

17. The method of claim 1 wherein the device is a camera or imaging device further comprising an imaging structure adapted to capture an image and a processor adapted to process a signal from the captured image.

18. The method of claim 1 wherein the device is a computer, computer component, or set-top box further comprising a display and a processor adapted to process at least one signal from the multiple signal sources.

19. The method of claim 1 wherein the device includes an antenna adapted to receive a signal to be converted from analog to digital or digital to analog.

20. The method of claim 1 wherein the device is a vehicle further comprising a processor adapted to process at least one signal from the multiple signal sources.

21. The method of claim 3, wherein the comparing step includes comparing a number of signals that are greater than the possible median signal value with a number of signals that are less than the possible median signal value.

22. A method for approximating the median signal value for the purpose of reducing errors in a device having a plurality of signal sources, each of the plurality of signal sources outputting a signal, the method comprising the steps of:

(a) providing a device which includes a plurality of signal sources generating signals which have a median signal value;

(b) selecting a possible median signal value for the signals;

(c) determining whether the signal generated by each signal source of a subset of the plurality of signal sources is greater or less than the possible median signal value;

(d) comparing the number of the plurality of signal sources whose signal is greater than the possible median signal value with the number of the plurality of the signal sources whose signal is less than the possible median signal value;

(e) adjusting the possible median signal value to be closer to a true median signal value based on the comparing step;

(f) repeating steps (c), (d) and (e) until the possible median signal value is substantially equal to the true median signal value; and (g) recording the difference between the signal generated by each signal source and the possible median signal value after the completion of the repeating step.

23. A method for approximating the median signal value for the purpose of reducing errors in a device having a plurality of signal sources, each of the plurality of signal sources outputting a signal, the method comprising the steps of:

(a) providing a device which includes a plurality of signal sources generating signals which have a median signal value;

(b) selecting a possible median signal value for the signals;

(c) determining whether the signal generated by each signal source of a subset of the plurality of signal sources is greater or less than the possible median signal value;

(d) comparing the number of the plurality of signal sources whose signal is greater than the possible median signal value with the number of the plurality of the signal sources whose signal is less than the possible median signal value;

(e) adjusting the possible median signal value to be closer to a true median signal value based on the comparing step;

(f) repeating steps (c), (d) and (e) until the possible median signal value is substantially equal to the true median signal value; and (g) selecting the plurality of signal sources by attempting to choose an equal number of signal sources whose signal is greater than the possible median signal value and signal sources whose signal is less than the possible median signal value.

24. A method for approximating the median signal value for the purpose of reducing errors in a device having a plurality of signal sources, each of the plurality of signal sources outputting a signal, the method comprising the steps of:
- (a) providing a device which includes a plurality of signal sources generating signals which have a median signal value;
- (b) selecting a possible median signal value for the signals;
- (c) determining whether the signal generated by each signal source of a subset of the plurality of signal sources is greater or less than the possible median signal value;
- (d) comparing the number of the plurality of signal sources whose signal is greater than the possible median signal value with the number of the plurality of the signal sources whose signal is less than the possible median signal value;
- (e) adjusting the possible median signal value to be closer to a true median signal value based on the comparing step; and
- (f) repeating steps (c), (d) and (e) until the possible median signal value is substantially equal to the true median signal value, wherein the comparing step determines whether the number of the plurality of signal sources whose signal is greater than the possible median signal value is larger than, smaller than, or equal to the number of the plurality of signal sources whose signal is less than the possible median signal value.

25. A method for approximating the median signal value for the purpose of reducing errors in a device having a plurality of signal sources, each of the plurality of signal sources outputting a signal, the method comprising the steps of:
- (a) providing a device which includes a plurality of signal sources generating signals which have a median signal value;
- (b) selecting a possible median signal value for the signals;
- (c) determining whether the signal generated by each signal source of a subset of the plurality of signal sources is greater or less than the possible median signal value;
- (d) comparing the number of the plurality of signal sources whose signal is greater than the possible median signal value with the number of the plurality of the signal sources whose signal is less than the possible median signal value;
- (e) adjusting the possible median signal value to be closer to a true median signal value based on the comparing step; and
- (f) repeating steps (c), (d) and (e) until the possible median signal value is substantially equal to the true median signal value, wherein the device is a digital-to-analog converter, each of the plurality of signal sources is a current source, each signal is a current, the true median signal value is a true median current value, and the possible median signal value is a possible median current value.

26. The method of claim 25 further comprising the step of:
- (g) categorizing each current source into one of a plurality of groups based on the current generated by the current source, wherein each of the plurality of groups covers a mutually exclusive range of currents and has a group median current value.

27. The method of claim 26 wherein each of the plurality of groups has a complementary group where the group median current value of each of the plurality of groups and its complementary group are substantially equally distant from the possible median current value.

28. The method of claim 27 wherein the group median current value of each of the plurality of groups and its complementary group are substantially equally distant from the possible median current value if the absolute value of the difference between the group median value of each of the plurality of groups and the possible median current value is substantially equal to the absolute value of the difference between the group median current value of the complementary group and the possible median current value.

29. The method of claim 26 wherein the plurality of groups include a center group whose range of currents includes the true median current value.

30. The method of claim 27 wherein the plurality of groups include a center group whose range of currents includes the possible median current value and the center group has no complementary group.

31. The method of claim 29 wherein the plurality of groups further comprise remaining non-center groups, each of the remaining non-center groups having a complementary group where the group median current values of each of the remaining non-center groups and its complementary group are substantially equally distant from the possible median current value.

32. The method of claim 27 further comprising the step of selecting the current source such that for each current source selected from the plurality of groups, another current source is selected from the complementary group.

33. The method of claim 31 further comprising the step of selecting the current source such that for each current source selected from the plurality of groups, another current source is selected from the complementary group and any odd current source to be selected is selected from the center group.

34. The method of claim 32 wherein the step of selecting the current sources selects those current sources categorized in groups closest to the median current value.

35. The method of claim 33 wherein the step of selecting the current sources selects those current sources categorized in groups closest to the median current value.

36. The method of claim 32 wherein the selecting step converts a digital signal into an analog signal.

37. A device having multiple signal sources, the device comprising:
- at least two signal sources, each of the at least two signal sources generating corresponding signals;
- a median selector providing a possible median signal value;
- a first circuit comparing at least one signal generated by the at least two signal sources to the possible median signal value; and
- the median selector adjusting the possible median signal value closer to a true median signal value of the corresponding signals, wherein the device is a digital-to-analog converter, the at least two signal sources are current sources, and the corresponding signals generated by each of the current sources is a current.

38. The device of claim 37 wherein each of the plurality of groups has a complementary group where the group median signal values of each of the plurality of groups and its complementary group are substantially equally distant from the possible median signal value when the possible median signal value is substantially equal to the true median signal value.

39. The device of claim 37 wherein the group median signal value of each of the plurality of groups and its complementary group are substantially equally distant from the possible median signal value when the absolute value of the difference between the group median signal value of each of the plurality of groups and the possible median signal value is close to the absolute value of the difference between the group median signal value of the complementary group and the possible median signal value, when the possible median signal value is substantially equal to the true median signal value.

40. The device of claim 38 further comprising a signal source selector that selects the signal source such that for each signal source selected from the plurality of groups, another signal source is selected from the complementary group.

41. The device of claim 40 wherein the signal source selector selects those signal sources categorized in groups closest to the true median signal value.

42. The device of claim 40 wherein the signal source selector uses the selected signal sources to convert a digital signal into an analog signal.

43. The device of claim 37 wherein the device is a television further comprising a processor adapted to process at least one signal from the multiple signal sources and a display adapted to display an image.

44. The device of claim 37 wherein the device is a tuner, broadcast receiver, or broadcast transmitter further comprising an interface adapted to receive or transmit a broadcast signal and a processor adapted to process the broadcasted signal.

45. The device of claim 37 wherein the device is a wireless handset further comprising an interface adapted to communicate with a wireless system and a processor adapted to process at least one signal from the multiple signal sources.

46. The device of claim 37 wherein the device is a modem further comprising an interface adapted to communicate with a telephone line and a processor adapted to process at least one signal from the multiple signal sources.

47. The device of claim 37 wherein the device is a camera or imaging device further comprising an imaging structure adapted to capture an image and a processor adapted to process a signal from the captured image.

48. The device of claim 37 wherein the device is a computer, computer component, or set-top box further comprising a display and a processor adapted to process at least one signal from the multiple signal sources.

49. The device of claim 37 wherein the device includes an antenna adapted to receive a signal to be converted from analog to digital or digital to analog.

50. The device of claim 37 wherein the device is a vehicle further comprising a processor adapted to process at least one signal from the multiple signal sources.

51. A device having multiple signal sources, the device comprising:
    at least two signal sources, each of the at least two signal sources generating corresponding signals;
    a median selector providing a possible median signal value;
    a first circuit comparing at least one signal generated by the at least two signal sources to the possible median signal value; and
    the median selector adjusting the possible median signal value closer to a true median signal value of the corresponding signals, wherein the first circuit compares the number of the at least two signal sources whose signal is greater than the possible median signal value with the number of the at least two signals sources whose signal is smaller than the possible median signal value.

52. A device having multiple signal sources, the device comprising:
    at least two signal sources each of the at least two signal sources generating corresponding signals;
    a median selector providing a possible median signal value;
    a first circuit comparing at least one signal generated by the at least two signal sources to the possible median signal value;
    the median selector adjusting the possible median signal value closer to a true median signal value of the corresponding signals,
    an error reduction system that controls the operation of the first circuit and the median selector until the possible median signal value is substantially equal to the true median signal value; and
    a categorizer that categorizes each of the at least two signal sources into one of a plurality of groups based on the signal generated by the at lest two signal sources, wherein each of the plurality of groups covers a mutually exclusive range of signals and has a group median signal value.

53. The device of claim 52 wherein the plurality of groups include a center group whose range of signals includes the true median signal value.

54. The device of claim 52 wherein the plurality of groups include a center group having no complementary group and whose range of signals includes the true median signal value.

55. The device of claim 53 wherein the plurality of groups further comprise remaining non-center groups, each of the remaining non-center groups having a complementary group where the group median signal values of the group and its complementary group are substantially equally distant from the possible median signal value when the possible median signal value is substantially equal to the true median signal value.

56. The device of claim 55 further comprising a signal source selector that selects the signal sources such that for each signal source selected from the plurality of groups, another signal source is selected from the complementary group and any odd signal source to be selected is selected from the center group.

57. The device of claim 54 further comprising a signal source selector that selects the signal sources such that for each signal source selected from the plurality of groups, another signal source is selected from the complementary group and any odd signal source to be selected is selected from the center group.

58. The device of claim 56 wherein the signal source selector selects those signal sources categorized in groups closest to the true median signal value.

59. The device of claim 57 wherein the signal source selector selects those signal sources categorized in groups closest to the true median signal value.

60. A data communication system comprising:
a receiver that receives a first analog signal;
an analog to digital converter that converts the first analog signal to a digital signal;
a data processor that processes the first analog signal;
a digital to analog converter that converts the digital signal to a second analog signal;
a transmitter that transmits the second analog signal, wherein the digital to analog converter includes
 a plurality of current sources generating currents having errors and a median current value;
 a median selector that selects a first current value;
 a first comparison circuit that compares the current generated by each current source of a subset of the plurality of current sources to the first current value;
 a second comparison circuit that compares the number of the current sources whose current is greater than the first current value with the number of the current sources whose current is less than the first current value; and
 an adjuster that adjusts the first current value to be closer to the median current value based on the comparison from the second comparison circuit.

61. The data communication system of claim 60 wherein the digital to analog converter further comprises:
 an error reduction system that controls the operation of the first comparison circuit, the second comparison circuit and the adjuster until the first current value is substantially equal to the median current value; and
 a categorizer that categorizes each current source into one of a plurality of groups based on the current generated by the current source, wherein each group covers a mutually exclusive range of currents and has a group median current value.

62. The data communication system of claim 61 wherein each group has a complementary group where the group median current values of the group and its complementary group are substantially equally distant from the first current value when the first current value is substantially equal to the median current value.

63. The data communication system of claim 61 wherein the groups include a center group having no complementary group and whose range of currents includes the median current value.

64. The data communication system of claim 61 wherein each of the remaining groups has a complementary group where the group median current values of the group and its complementary group are substantially equally distant from the first current value when the first current value is substantially equal to the median current value.

65. The data communication system of claim 61 further comprising a current source selector that selects the current sources such that for each current source selected from a group, a current source is selected from the complementary group.

66. The data communication system of claim 60 wherein the data communication system is a modem wherein the receiver is adapted to receive the first analog signal from a telephone line.

67. The data communication system of claim 60 wherein the data communication system is a satellite transmission system wherein the digital to analog converter is adapted to convert a digital signal from a satellite to the second analog signal.

68. The data communication system of claim 60 wherein the data communication system is a CD player/recorder system wherein the digital to analog converter is adapted to convert a digital signal from the CD player/recorder system to the second analog signal.

69. The data communication system of claim 63 wherein the data communication system is a facsimile machine further comprising an interface adapted to communicate with a telephone line and wherein the receiver is adapted to receive the first analog signal from the telephone line and the transmitter is adapted to transmit the second analog signal to the telephone line.

70. A method for approximating the median signal value for the purpose of reducing errors in a device having a plurality of signal sources, each of the plurality of signal sources outputting a signal, the method comprising the steps of:
 (a) providing a device which includes a plurality of signal sources generating signals which have a median signal value;
 (b) selecting a possible median signal value for the signals;
 (c) determining whether the signal generated by each signal source of a subset of the plurality of signal sources is greater or less than the possible median signal value;
 (d) comparing the number of the plurality of signal sources whose signal is greater than the possible median signal value with the number of the plurality of the signal sources whose signal is less than the possible median signal value;
 (e) adjusting the possible median signal value to be closer to a true median signal value based on the comparing step; and
 (f) repeating steps (c), (d) and (e) until the possible median signal value is substantially equal to the true median signal value, wherein the repeating step repeats steps (c), (d) and (e) until it has repeated those steps a certain number of times.

71. A method for approximating the median signal value for the purpose of reducing errors in a device having a plurality of signal sources, each of the plurality of signal sources outputting a signal, the method comprising the steps of:
 (a) providing a device which includes a plurality of signal sources generating signals which have a median signal value;
 (b) selecting a possible median signal value for the signals;
 (c) determining whether the signal generated by each signal source of a subset of the plurality of signal sources is greater or less than the possible median signal value;
 (d) comparing the number of the plurality of signal sources whose signal is greater than the possible median signal value with the number of the plurality of the signal sources whose signal is less than the possible median signal value;
 (e) adjusting the possible median signal value to be closer to a true median signal value based on the comparing step; and
 (f) repeating steps (c), (d) and (e) until the possible median signal value is substantially equal to the true median signal value, wherein the subset is all of the plurality of signal sources.

* * * * *